United States Patent [19]

Harman

[11] Patent Number: 4,513,250
[45] Date of Patent: Apr. 23, 1985

[54] SIGNAL CUBER

[75] Inventor: Stephen G. Harman, Nepean, Canada

[73] Assignee: Northern Telecom Limited, Montreal, Canada

[21] Appl. No.: 499,309

[22] Filed: May 31, 1983

[51] Int. Cl.³ .................. H03B 1/04; H03F 1/32
[52] U.S. Cl. .................. 328/163; 328/142; 330/149; 333/218
[58] Field of Search .............. 328/142, 143, 144, 163; 330/149; 333/218

[56] References Cited

U.S. PATENT DOCUMENTS

| | | | |
|---|---|---|---|
| 3,348,155 | 10/1967 | Von Recklinghausen | 328/144 |
| 3,407,350 | 10/1968 | Isobe et al. | 333/218 |
| 3,825,843 | 7/1974 | Felsberg et al. | 328/163 |
| 3,911,369 | 10/1975 | Seidel | 328/163 |
| 4,122,399 | 10/1978 | Heiter et al. | 328/163 |
| 4,157,508 | 6/1979 | Hecken | 328/142 |
| 4,465,980 | 8/1984 | Huang et al. | 330/149 |

Primary Examiner—John S. Heyman
Attorney, Agent, or Firm—R. John Haley

[57] ABSTRACT

A signal cuber for producing the third harmonic of an input signal, for use in a signal distortion correction circuit, comprises a split-ring mixer having two ports, at which there is produced a signal at the second harmonic of the input signal, unequally terminated, whereby the second harmonic signal is reflected into the mixer to be mixed with the input signal to produce the third harmonic. The mixer can consist of transformers and diodes, which can be Schottky diodes which are forward biassed by a potential difference supplied to the ports via the unequal terminations, which may be constituted by a single resistor.

8 Claims, 1 Drawing Figure

U.S. Patent   Apr. 23, 1985   4,513,250
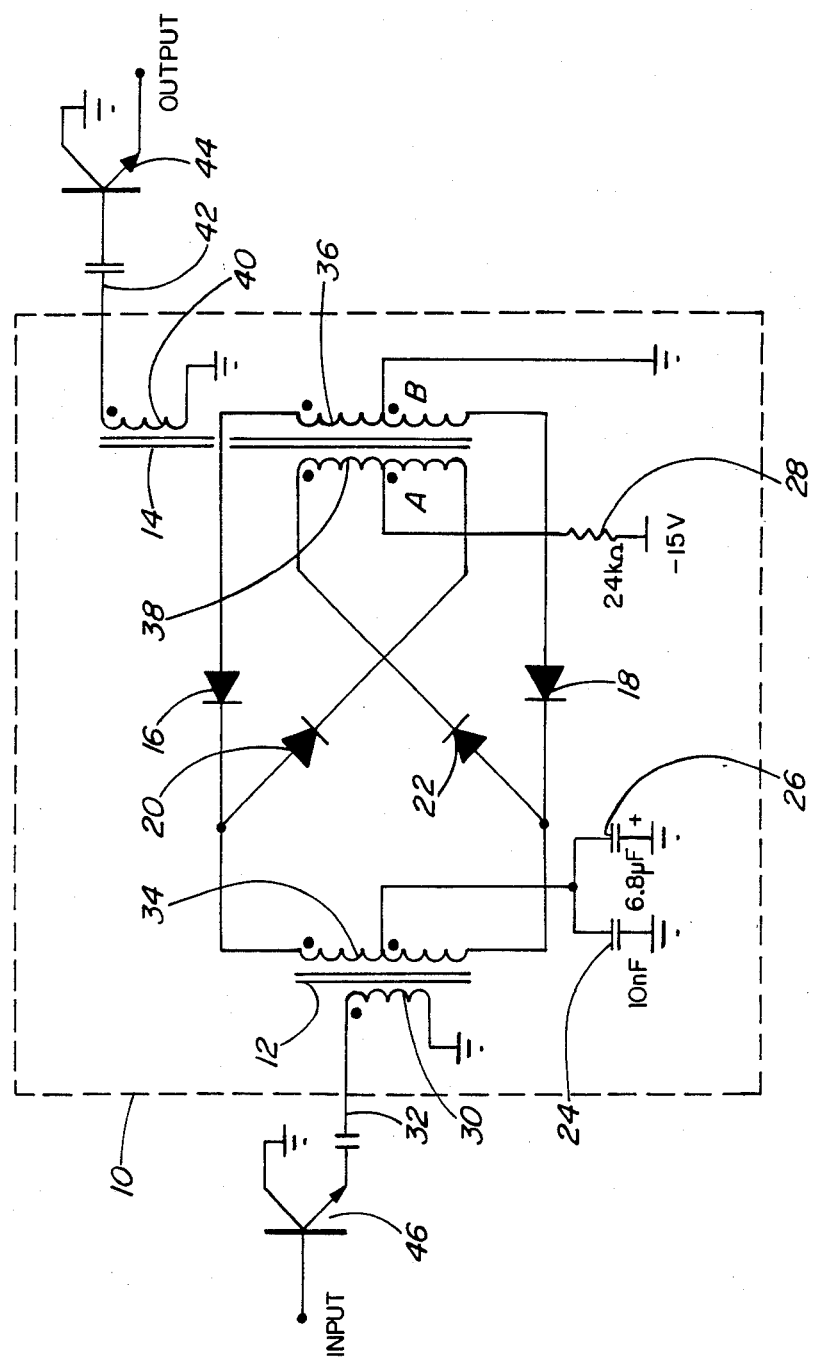

SIGNAL CUBER

This invention relates to a signal cuber for use in signal distortion compensating circuits.

In order to compensate for non-linearity of certain electronic equipment, such as a microwave power amplifier, it is known to predistort a signal by deliberately generating higher order signal components which are used to cancel corresponding signal components inadvertently produced in the equipment. Such predistortion techniques enable more efficient operation of microwave power amplifiers, for example, to be achieved.

Non-linearity of microwave power amplifiers gives rise to a predominantly third order signal distortion, i.e. unwanted signal components at the third harmonic of the input signal are produced. A signal cuber can be used to generate corresponding third order signal components which are used to predistort the input signal and thereby compensate for the non-linearity of the amplifier. This technique is known and described for example in Hecken U.S. Pat. No. 4,157,508 issued June 5, 1979.

In the above patent a signal cuber is described which uses so-called back diodes, i.e. tunnel diodes operated with reverse bias and connected in parallel with opposite polarity. Such diodes have the disadvantages of being less readily available and less reliable than Schottky diodes. In Felsberg et al. U.S. Pat. No. 3,825,843 there is described a compensation circuit comprising a complicated form of signal cuber using, in its balanced form, numerous components such as hybrid circuits, multipliers, bias circuits, amplifiers, a delay line, a squarer, and a high pass filter.

An object of this invention, therefore, is to provide an improved signal cuber.

According to this invention there is provided a signal cuber comprising a split-ring mixer having an input, an output, and two ports at which in response to an input signal applied to the input of the mixer there is produced a signal having a frequency component at the second harmonic of the input signal, and means for unequally terminating said ports to reflect at least part of said frequency component back into the mixer, thereby to produce a frequency component at the third harmonic of the input signal at the output of the mixer.

Thus the second harmonic frequency component produced by the split-ring mixer is reflected at the ports to be mixed with the input signal to produce the third harmonic frequency component which is desired, the second harmonic component being cancelled from the output of the mixer.

In a preferred embodiment the split-ring mixer comprises an input transformer having a first winding coupled to the input and a second winding having a center tap coupled to a point of reference potential; an output transformer having a first winding having a center tap which constitutes one of the two ports, a second winding having a center tap which constitutes the other of the two ports, and a third winding coupled to the output; and two pairs of diodes, the diodes of each pair being connected in series with the same polarity between a respective terminal of the first winding of the output transformer and a respective terminal of the second winding of the output transformer, with the junction between each pair of diodes being connected to a respective terminal of the second winding of the input transformer.

Preferably the center tap of the second winding of the input transformer is capacitively coupled to the point of reference potential, and the means for unequally terminating said ports comprises resistive means coupling said ports to points having a potential difference therebetween, the potential difference forward biassing said pairs of diodes via the resistive means and the first and second windings of the output transformer.

The diodes are preferably Schottky diodes, which are forward biassed as recited above to operate in the square-law portion of their characteristic.

The signal cuber preferably includes an amplifier stage having a high input impedance coupled to the output of the mixer, and preferably includes an amplifier stage having a low output impedance coupled to the input of the mixer. Each of these amplifier stages conveniently comprises a common collector transistor stage.

The invention will be further understood from the following description with reference to the accompanying drawing, which schematically illustrates a signal cuber according to a preferred embodiment of the invention.

Referring to the drawing, the signal cuber itself is shown within a broken line box 10 and comprises two balanced transformers 12 and 14 each with a 1:1 ratio, four Schottky diodes 16, 18, 20 and 22, two capacitors 24 and 26, and a resistor 28.

The transformers 12 and 14 and the diodes 16, 18, 20, and 22 are generally arranged in the known form of a split-ring mixer. Thus the transformer 12 has a primary winding 30 to which an input signal is applied from an input 32 of the cuber, and a center-tapped secondary winding 34. The transformer 14 has two center-tapped primary windings 36 and 38 and a secondary winding 40 from which an output signal is applied to an output 42 of the cuber. The ends of the winding 34 are coupled to the ends of the winding 36 via the diodes 16 and 18 and are cross-coupled to the ends of the winding 38 via the oppositely-poled diodes 20 and 22. The senses of the windings are denoted by dots in the drawing.

The cuber differs from the known split-ring mixer in that the center tap of the winding 34 is grounded for a.c. signals via the capacitors 24 and 26, and the center taps of the windings 36 and 38, referred to here as ports B and A respectively, are unequally terminated. In a split-ring mixer these ports A and B would be connected together. In accordance with the invention, however, these ports are unequally terminated so that a signal present at the port A, and having a frequency component at the second harmonic of an input signal applied to the input 32, is reflected back into the cuber with a 180 degree phase relationship.

In a limiting situation, one of the ports is open-circuit and the other is a short-circuit to ground. This situation is approximated in the cuber in the drawing in that the port B is grounded and the port A is coupled via the relatively high-valued resistor 28 to a negative supply voltage, as explained further below.

The reflected second harmonic signal is mixed with the input signal in the transformer 14, the phase relationship causing a summation of the resultant third harmonic components in the winding 40 and causing a cancellation of the second harmonic components (and other even harmonic components). The manner in which this is effected is similar to the action of the multiplier 47 in Felsberg et al. U.S. Pat. No. 3,825,843 already referred to, as described in column 6, lines 20 to 33 of that patent.

Whereas, in the prior art cubers referred to, back diodes have been required to provide a square-law characteristic without complicated biassing arrangements, in the present cuber the diodes are Schottky diodes which are forward-biassed to operate in the square-law part of their characteristic. The different characteristics of back diodes and Schottky diodes are known, see for example FIG. 7 of Felsberg et al. U.S. Pat. No. 3,825,843, and need not be discussed here. The forward biassing of the diodes in the present cuber is achieved via the port B, windings 36 and 38 of the transformer 14, port A and resistor 28, in conjunction with the negative supply voltage of for example −15 volts supplied to the end of the resistor 28 opposite to the port A. The forward bias of the diodes can if desired be adjusted, by means not shown, to minimize the amount of fifth harmonic and higher odd order distortion of the input signal which is produced by the cuber.

The drawing also illustrates preferred forms of input and output amplifier stage terminations for the cuber, in each case only a coupling capacitor and a transistor being shown, biassing arrangements for the transistors being omitted for the sake of clarity. The output 42 is terminated with a high impedance, constituted by capacitive coupling to the base of a transistor 44 operated in a common collector configuration. The use of a high termination impedance at the output avoids a 6 dB matching loss, and a 6 dB to 8 dB loss of separation between third and fifth order components of the input signal, which would occur if the output were terminated with the characteristic impedance of the transformer 14.

The input 32 is supplied from a low impedance, constituted by capacitive coupling to the emitter of a transistor 46 operated in a common collector configuration, to realize optimum fidelity of the cuber.

Numerous modifications to the cuber described above can be made without departing from the scope of the claims. For example, each of the diodes 16, 18, 20, and 22 could be replaced by a plurality of series-connected diodes to enable an increase in peak voltage swings. The terminations at the ports A and B could be modified, and in particular could be made frequency selective if desired. In addition, the second harmonic signal component at the port A could be separately combined with the third harmonic signal at the output of the cuber to generate a fifth harmonic signal component which could be used for further predistortion purposes. The Schottky diodes could also be replaced by back diodes, in which case the capacitors 24 and 26 and the negative supply voltage could be dispensed with.

Furthermore, whilst the described embodiment is a balanced double sideband arrangement, which gives high conversion efficiency, the invention is equally applicable to a single sideband arrangement. For example, the port B may, instead of being connected directly to ground as described above, be connected to ground via a 24 kilohm resistor in parallel with a 220 picofarad capacitor, this arrangement causing the signal cuber to operate on only an upper sideband. However, the double sideband arrangement is preferred in view of its better efficiency and more accurate cancellation of distortion generated by a typical FET power amplifier.

What is claimed is:

1. A signal cuber comprising a split-ring mixer having an input, an output, and two ports at which in response to an input signal applied to the input of the mixer there is produced a signal having a frequency component at the second harmonic of the input signal, and means for unequally terminating said ports to reflect at least part of said frequency component back into the mixer, thereby to produce a frequency component at the third harmonic of the input signal at the output of the mixer.

2. A signal cuber as claimed in claim 1 wherein the split-ring mixer comprises an input transformer having a first winding coupled to the input and a second winding having a center tap coupled to a point of reference potential; an output transformer having a first winding having a center tap which constitutes one of the two ports, a second winding having a center tap which constitutes the other of the two ports, and a third winding coupled to the output; and two pairs of diodes, the diodes of each pair being connected in series with the same polarity between a respective terminal of the first winding of the output transformer and a respective terminal of the second winding of the output transformer, with the junction between each pair of diodes being connected to a respective terminal of the second winding of the input transformer.

3. A signal cuber as claimed in claim 2 wherein the center tap of the second winding of the input transformer is capacitively coupled to the point of reference potential, and the means for unequally terminating said ports comprises resistive means coupling said ports to points having a potential difference therebetween, the potential difference forward biassing said pairs of diodes via the resistive means and the first and second windings of the output transformer.

4. A signal cuber as claimed in claim 3 wherein the diodes are Schottky diodes.

5. A signal cuber as claimed in claim 1 and including an amplifier stage having a high input impedance coupled to the output of the mixer.

6. A signal cuber as claimed in claim 5 wherein the amplifier stage comprises a common collector transistor stage.

7. A signal cuber as claimed in claim 1 and including an amplifier stage having a low output impedance coupled to the input of the mixer.

8. A signal cuber as claimed in claim 7 wherein the amplifier stage comprises a common collector transistor stage.

* * * * *